United States Patent
Yuan et al.

(10) Patent No.: US 10,186,620 B1
(45) Date of Patent: Jan. 22, 2019

(54) INGAALP SCHOTTKY FIELD EFFECT TRANSISTOR WITH STEPPED BANDGAP OHMIC CONTACT

(71) Applicant: WIN Semiconductors Corp., Tao Yuan (TW)

(72) Inventors: Cheng-Guan Yuan, Tao Yuan (TW); Shih-Ming Joseph Liu, Tao Yuan (TW); Hsi-Tsung Lin, Tao Yuan (TW); Chia Hsiung Lee, Tao Yuan (TW)

(73) Assignee: WIN SEMICONDUCTOR CORP., Tao Yuan (TW)

( * ) Notice: Subject to any disclaimer, the term of this patent is extended or adjusted under 35 U.S.C. 154(b) by 0 days.

(21) Appl. No.: 15/797,479

(22) Filed: Oct. 30, 2017

(30) Foreign Application Priority Data

Sep. 6, 2017 (TW) .............................. 106130507 A

(51) Int. Cl.
*H01L 29/08* (2006.01)
*H01L 29/812* (2006.01)
*H01L 29/423* (2006.01)
*H01L 29/205* (2006.01)

(52) U.S. Cl.
CPC .......... *H01L 29/812* (2013.01); *H01L 29/205* (2013.01); *H01L 29/42312* (2013.01)

(58) Field of Classification Search
CPC ........... H01L 29/0891; H01L 29/42312; H01L 29/66257; H01L 29/7308; H01L 27/095
See application file for complete search history.

(56) References Cited

U.S. PATENT DOCUMENTS

2015/0357457 A1* 12/2015 Ritenour ............... H01L 29/517
257/76

* cited by examiner

*Primary Examiner* — Hoai V Pham
(74) *Attorney, Agent, or Firm* — Muncy, Geissler, Olds & Lowe, P.C.

(57) ABSTRACT

An InGaAlP Schottky field effect transistor with stepped bandgap ohmic contact, comprising: a buffer layer, a channel layer, a carrier supply layer, a Schottky barrier layer, an intermediate bandgap layer, a cap layer and an ohmic metal layer sequentially formed on a compound semiconductor substrate; wherein the Schottky barrier layer is made of InGaAlP; the ohmic metal layer and the cap layer form an ohmic contact. The Schottky barrier layer, the intermediate bandgap layer and the cap layer have a Schottky-barrier-layer bandgap, an intermediate bandgap and a cap-layer bandgap respectively, wherein the intermediate bandgap is less than the Schottky-barrier-layer bandgap and greater than the cap-layer bandgap.

8 Claims, 8 Drawing Sheets

INGAALP SCHOTTKY FIELD EFFECT TRANSISTOR WITH STEPPED BANDGAP OHMIC CONTACT

FIELD OF THE INVENTION

The present invention relates to an InGaAlP Schottky field effect transistor, especially related to an InGaAlP Schottky field effect transistor with stepped bandgap ohmic contact.

BACKGROUND OF THE INVENTION

Please refer to FIG. 10, which is a sectional schematic view of an embodiment of an InGaAlP Schottky field effect transistor of conventional technology. The main structure of the InGaAlP Schottky field effect transistor 9 of conventional technology comprises: a compound semiconductor substrate 901, a buffer layer 902, a lower barrier layer 920, a first spacer layer 906, a channel layer 907, a second spacer layer 908, an upper barrier layer 930, a cap layer 912, a source electrode 916 (913), a drain electrode 917 (913), a gate recess 915 and a gate electrode 914. The compound semiconductor substrate 901 is made of GaAs. The buffer layer 902 is formed on the compound semiconductor substrate 901, wherein the buffer layer 902 is made of GaAs. The lower barrier layer 920 is formed on the buffer layer 902, wherein the lower barrier layer 920 is made of AlGaAs. The lower barrier layer 920 comprises a lower-barrier sub-layer 903, a lower carrier supply layer 904 and a lower-barrier spacer layer 905, wherein the lower-barrier sub-layer 903 is formed on the buffer layer 902; the lower carrier supply layer 904 is formed on the lower-barrier sub-layer 903; the lower-barrier spacer layer 905 is formed on the lower carrier supply layer 904. The first spacer layer 906 is formed on the lower-barrier spacer layer 905 of the lower barrier layer 920, wherein the first spacer layer 906 is made of GaAs. The channel layer 907 is formed on the first spacer layer 906, wherein the channel layer 907 is made of InGaAs. The second spacer layer 908 is formed on the channel layer 907, wherein the second spacer layer 908 is made of GaAs. The upper barrier layer 930 is formed on the second spacer layer 908, wherein the upper barrier layer 930 is made of InGaAlP. The upper barrier layer 930 comprises an upper-barrier spacer layer 909, an upper carrier supply layer 910 and a Schottky barrier layer 911, wherein the upper-barrier spacer layer 909 is formed on the second spacer layer 908; the upper carrier supply layer 910 is formed on the upper-barrier spacer layer 909; the Schottky barrier layer 911 is formed on the upper carrier supply layer 910. The cap layer 912 is formed on the Schottky barrier layer 911 of the upper barrier layer 930, wherein the cap layer 912 is made of GaAs. An ohmic electrode layer 913 is formed on the cap layer 912, wherein the ohmic electrode layer 913 and the cap layer 912 form an ohmic contact. Patterning the ohmic electrode layer 913 and then etching the cap layer 912 to form the gate recess 915, wherein the etching is stopped at the Schottky barrier layer 911 such that a bottom of the gate recess 915 is defined by the Schottky barrier layer 911. In the left side of FIG. 10, the ohmic electrode layer 913 and the cap layer 912 form the ohmic contact to form the source electrode 916; while, in the right side of FIG. 10, the ohmic electrode layer 913 and the cap layer 912 form the ohmic contact to form the drain electrode 917. The gate electrode 914 is formed on the Schottky barrier layer 911 within the gate recess 915. And the gate electrode 914 and the Schottky barrier layer 911 form a Schottky contact.

The material of the Schottky barrier layer 911 is based on InGaAlP instead of the more commonly used AlGaAs in conventional technology. The bandgap of InGaAlP is higher than the bandgap of AlGaAs, when comparing the field effect transistor 9 having the InGaAlP (higher bandgap) Schottky barrier layer 911 and the field effect transistor having the AlGaAs (lower bandgap) Schottky barrier layer, the field effect transistor 9 having the InGaAlP (higher bandgap) Schottky barrier layer 911 has a lower leakage current and a higher breakdown voltage. Since the material of the Schottky barrier layer 911 is InGaAlP which has a higher bandgap such that the bankgap difference between the Schottky barrier layer 911 and the cap layer 912 will be too huge. Hence, it will result in a barrier to the electron current and will affects the performance of the field effect transistor 9, such as increasing the on-state resistance (Ron), reducing the high speed switching ability and decreasing the microwave amplification gain.

Accordingly, the present invention has developed a new design which may avoid the above mentioned drawbacks, may significantly enhance the performance of the devices and may take into account economic considerations. Therefore, the present invention then has been invented.

SUMMARY OF THE INVENTION

The main technical problem that the present invention is seeking to solve is to narrow the bankgap difference between the InGaAlP Schottky barrier layer and the cap layer so that the on-state resistance (Ron) of the InGaAlP Schottky field effect transistor will be decreased, the high speed switching ability of the InGaAlP Schottky field effect transistor will be enhanced, and the microwave amplification gain will be increased.

In order to solve the problems mentioned the above and to achieve the expected effect, the present invention provides an InGaAlP Schottky field effect transistor with stepped bandgap ohmic contact comprising: a compound semiconductor substrate, a buffer layer, a channel layer, a carrier supply layer, a Schottky barrier layer, an intermediate bandgap layer, a cap layer and an ohmic metal layer, wherein the buffer layer is formed on the compound semiconductor substrate; the channel layer is formed on the buffer layer; the carrier supply layer is formed on the channel layer; the Schottky barrier layer is formed on the carrier supply layer, wherein the Schottky barrier layer is made of InGaAlP; the intermediate bandgap layer is formed on the Schottky barrier layer; the cap layer is formed on the intermediate bandgap layer; the ohmic metal layer is formed on the cap layer, wherein the ohmic metal layer and the cap layer form an ohmic contact; wherein the Schottky barrier layer, the intermediate bandgap layer and the cap layer have a Schottky-barrier-layer bandgap, an intermediate bandgap and a cap-layer bandgap respectively, wherein the intermediate bandgap is less than the Schottky-barrier-layer bandgap and greater than the cap-layer bandgap.

In an embodiment of the InGaAlP Schottky field effect transistor with stepped bandgap ohmic contact, the intermediate bandgap layer is made of $Al_xGa_{1-x}As$.

In an embodiment of the InGaAlP Schottky field effect transistor with stepped bandgap ohmic contact, the aluminum composition x is greater than or equal to 0.1 and less than or equal to 0.3.

In an embodiment of the InGaAlP Schottky field effect transistor with stepped bandgap ohmic contact, the intermediate bandgap layer is made of at least one material selected from the group consisting of: InGaP, InGaAsP and InAlP.

In an embodiment of the InGaAlP Schottky field effect transistor with stepped bandgap ohmic contact, it further comprises an etching stop layer, wherein the etching stop layer is formed between the intermediate bandgap layer and the cap layer.

In an embodiment of the InGaAlP Schottky field effect transistor with stepped bandgap ohmic contact, the etching stop layer is made of AlAs.

In an embodiment of the InGaAlP Schottky field effect transistor with stepped bandgap ohmic contact, the cap layer is made of GaAs.

For further understanding the characteristics and effects of the present invention, some preferred embodiments referred to drawings are in detail described as follows.

DETAILED DESCRIPTIONS OF PREFERRED EMBODIMENTS

Figure 1:
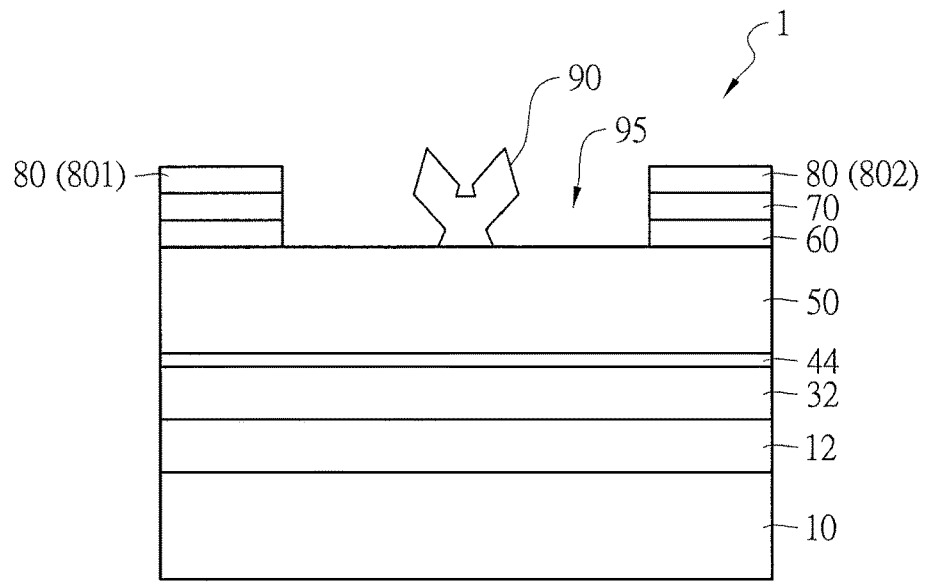
FIG. 1 is a sectional schematic view of an embodiment of an InGaAlP Schottky field effect transistor with stepped bandgap ohmic contact of the present invention.
Figure 9A:
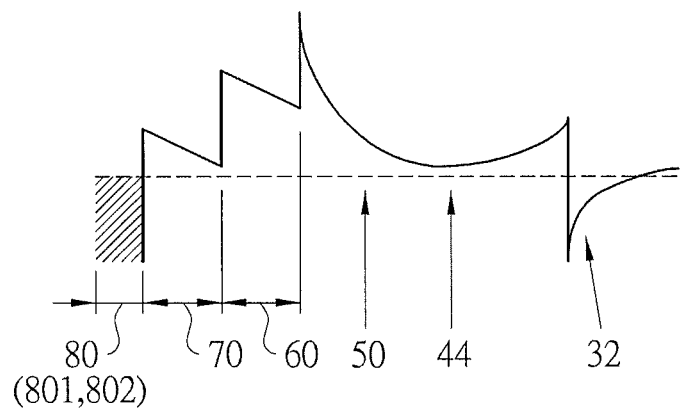
FIG. 9A is a schematic diagram of the bandgap of an embodiment of an InGaAlP Schottky field effect transistor with stepped bandgap ohmic contact of the present invention.

Please refer to FIG. 1, which is a sectional schematic view of an embodiment of an InGaAlP Schottky field effect transistor with stepped bandgap ohmic contact of the present invention. An InGaAlP Schottky field effect transistor 1 with stepped bandgap ohmic contact of the present invention comprises: a compound semiconductor substrate 10, a buffer layer 12, a channel layer 32, a carrier supply layer 44, a Schottky barrier layer 50, an intermediate bandgap layer 60, a cap layer 70, an ohmic metal layer 80, a gate recess 95 and a gate electrode 90. The compound semiconductor substrate 10 is made of GaAs. The buffer layer 12 is formed on the compound semiconductor substrate 10, wherein the buffer layer 12 is made of GaAs or AlGaAs. The channel layer 32 is formed on the buffer layer 12, wherein the channel layer 32 is made of $In_xGa_{1-x}As$, wherein the ratio of the composition of indium to gallium is x:1−x, wherein x is greater than or equal to 0.2 and less than or equal to 0.5. In a preferable embodiment, x is greater than or equal to 0.3 and less than or equal to 0.4. The carrier supply layer 44 is formed on the channel layer 32, wherein the carrier supply layer 44 is made of at least one material selected from the group consisting of: GaAs, AlGaAs, InGaP and InGaAlP. The Schottky barrier layer 50 is formed on the carrier supply layer 44, wherein the Schottky barrier layer 50 is made of InGaAlP. The intermediate bandgap layer 60 is formed on the Schottky barrier layer 50, wherein the intermediate bandgap layer 60 is made of at least one material selected from the group consisting of: InGaP, InGaAsP, InAlP and AlGaAs. In a preferable embodiment, the intermediate bandgap layer 60 is made of $Al_xGa_{1-x}As$, wherein the ratio of the composition of aluminum to gallium is x:1−x, wherein x is greater than or equal to 0.1 and less than or equal to 0.3. The cap layer 70 is formed on the intermediate bandgap layer 60, wherein the cap layer 70 is made of GaAs. The ohmic metal layer 80 is formed on the cap layer 70, wherein the ohmic metal layer 80 and the cap layer 70 form an ohmic contact. In some embodiments, the cap layer 70 is formed of the material of GaAs doped with Si with a high concentration. Patterning the ohmic metal layer 80 and then etching the cap layer 70 and the intermediate bandgap layer 60 to form the gate recess 95, wherein the etching is stopped at the Schottky barrier layer 50 such that a bottom of the gate recess 95 is defined by the Schottky barrier layer 50. The gate electrode 90 is formed on the Schottky barrier layer 50 within the gate recess 95. And the gate electrode 90 and the Schottky barrier layer 50 form a Schottky contact. In the left side of FIG. 1, the ohmic metal layer 80 and the cap layer 70 form the ohmic contact to form a source electrode 801; while, in the right side of FIG. 1, the ohmic metal layer 80 and the cap layer 70 form the ohmic contact to form the drain electrode 802. The Schottky barrier layer 50, the intermediate bandgap layer 60 and the cap layer 70 have a Schottky-barrier-layer bandgap, an intermediate bandgap and a cap-layer bandgap respectively, wherein the intermediate bandgap is less than the Schottky-barrier-layer bandgap and greater than the cap-layer bandgap. Please also refer to FIG. 9A, which is a schematic diagram of the bandgap of an embodiment of an InGaAlP Schottky field effect transistor with stepped bandgap ohmic contact of the present invention. FIG. 9A shows the schematic diagram of the bandgap of the channel layer 32, the carrier supply layer 44, the Schottky barrier layer 50, the intermediate bandgap layer 60, the cap layer 70 and the ohmic metal layer 80 (including the source electrode 801 and the drain electrode 802) of the embodiment of FIG. 1. If there is no such an intermediate bandgap layer 60, then the bankgap difference between the Schottky barrier layer 50 and the cap layer 70 will be too huge. The present invention provides the intermediate bandgap layer 60 formed between the Schottky barrier layer 50 and the cap layer 70. The intermediate bandgap of the intermediate bandgap layer 60 is less than the Schottky-barrier-layer bandgap of the Schottky barrier layer 50 and greater than the cap-layer bandgap of the cap layer 70, therefore, the present invention provides the stepped bandgap layer (the intermediate bandgap layer 60) to lower down the bankgap difference between the Schottky barrier layer 50 and the cap layer 70 such that the on-state resistance (Ron) of the InGaAlP Schottky field effect transistor 1 with stepped bandgap ohmic contact of the present invention is reduced. Hence, the high speed switching ability and the microwave amplification gain of the InGaAlP Schottky field effect transistor 1 with stepped bandgap ohmic contact of the present invention are enhanced.

In some embodiments, the intermediate bandgap layer 60 is made of $Al_xGa_{1-x}As$, wherein the ratio of the composition of aluminum to gallium is x:1−x, wherein x is greater than or equal to 0.1 and less than or equal to 0.28, greater than or equal to 0.1 and less than or equal to 0.26, greater than or equal to 0.1 and less than or equal to 0.24, greater than or equal to 0.1 and less than or equal to 0.22, greater than or equal to 0.1 and less than or equal to 0.2, greater than or equal to 0.12 and less than or equal to 0.3, greater than or equal to 0.14 and less than or equal to 0.3, greater than or equal to 0.16 and less than or equal to 0.3, greater than or equal to 0.18 and less than or equal to 0.3 or greater than or equal to 0.2 and less than or equal to 0.3.

Figure 2:
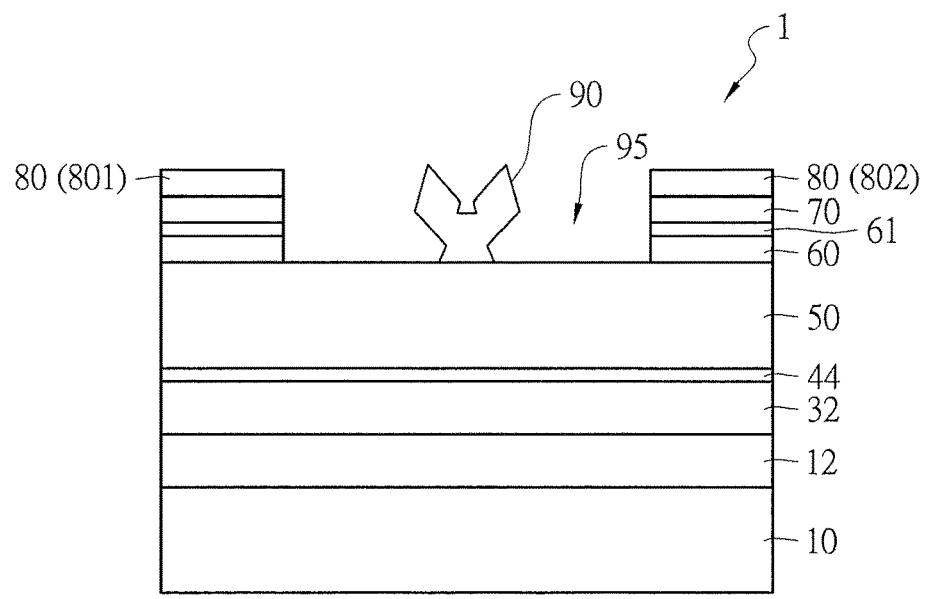
FIG. 2 is a sectional schematic view of an embodiment of another InGaAlP Schottky field effect transistor with stepped bandgap ohmic contact of the present invention.

Please refer to FIG. 2, which is a sectional schematic view of an embodiment of another InGaAlP Schottky field effect transistor with stepped bandgap ohmic contact of the present invention. The main structure of the embodiment of FIG. 2 is basically the same as the structure of the embodiment of FIG. 1, except that it further comprises an etching stop layer 61, wherein the etching stop layer 61 is formed between the intermediate bandgap layer 60 and the cap layer 70, wherein the etching stop layer 61 is made of AlAs.

Figure 3:
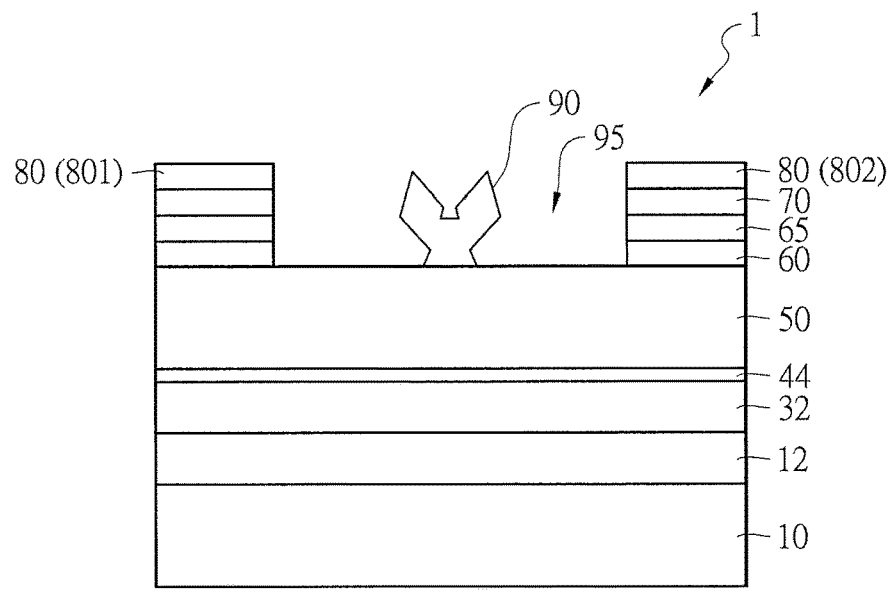
FIG. 3 is a sectional schematic view of an embodiment of an InGaAlP Schottky field effect transistor with stepped bandgap ohmic contact of the present invention.
Figure 9B:
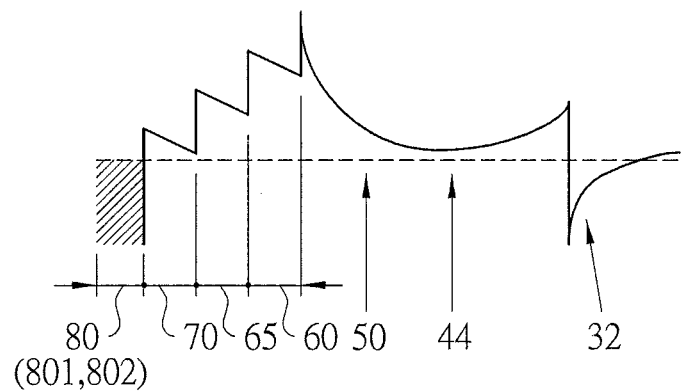
FIG. 9B is a schematic diagram of the bandgap of another embodiment of an InGaAlP Schottky field effect transistor with stepped bandgap ohmic contact of the present invention.
Figure 10:
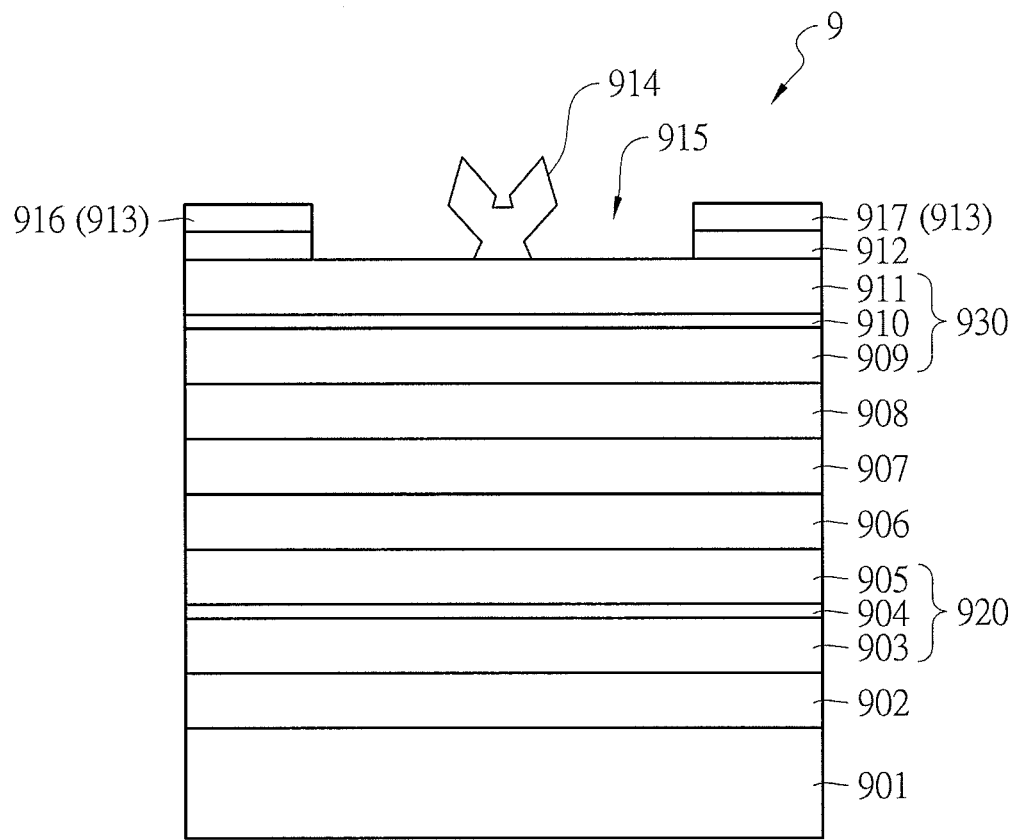
FIG. 10 is a sectional schematic view of an embodiment of an InGaAlP Schottky field effect transistor of conventional technology.

Please refer to FIG. 3, which is a sectional schematic view of an embodiment of an InGaAlP Schottky field effect transistor with stepped bandgap ohmic contact of the present invention. The main structure of the embodiment of FIG. 3 is basically the same as the structure of the embodiment of FIG. 1, except that it further comprises a sub-intermediate bandgap layer 65, wherein the sub-intermediate bandgap layer 65 is formed between the intermediate bandgap layer 60 and the cap layer 70. The sub-intermediate bandgap layer 65 has a sub-intermediate bandgap, wherein the sub-intermediate bandgap is less than the intermediate bandgap and greater than the cap-layer bandgap. The sub-intermediate bandgap layer 65 is made of at least one material selected from the group consisting of: InGaP, InGaAsP, InAlP and AlGaAs. In a preferable embodiment, the intermediate bandgap layer 60 is made of $Al_xGa_{1-x}As$, wherein the ratio of the composition of aluminum to gallium is x:1−x, wherein x is greater than or equal to 0.1 and less than or equal to 0.3; while the sub-intermediate bandgap layer 65 is made of $Al_yGa_{1-y}As$, wherein the ratio of the composition of aluminum to gallium is y:1−y, wherein y is less than x. Please also refer to FIG. 9B, which is a schematic diagram of the bandgap of another embodiment of an InGaAlP Schottky field effect transistor with stepped bandgap ohmic contact of the present invention. FIG. 9B shows the schematic diagram of the bandgap of the channel layer 32, the carrier supply layer 44, the Schottky barrier layer 50, the intermediate bandgap layer 60, the sub-intermediate bandgap layer 65, the cap layer 70 and the ohmic metal layer 80 (including the source electrode 801 and the drain electrode 802) of the embodiment of FIG. 3. The present invention provides the intermediate bandgap layer 60 and the sub-intermediate bandgap layer 65 formed between the Schottky barrier layer 50 and the cap layer 70. The intermediate bandgap of the intermediate bandgap layer 60 is less than the Schottky-barrier-layer bandgap of the Schottky barrier layer 50 and greater than the sub-intermediate bandgap of the sub-intermediate bandgap layer 65; while the sub-intermediate bandgap of the sub-intermediate bandgap layer 65 is less than the intermediate bandgap of the intermediate bandgap layer 60 and greater than the cap-layer bandgap of the cap layer 70. Therefore, the present invention provides more slowly rising stepped bandgap layers (the intermediate bandgap layer 60 and the sub-intermediate bandgap layer 65) to lower down the bankgap difference between the Schottky barrier layer 50 and the cap layer 70 such that the on-state resistance (Ron) of the InGaAlP Schottky field effect transistor 1 with stepped bandgap ohmic contact of the present invention is reduced. Hence, the high speed switching ability and the microwave amplification gain of the InGaAlP Schottky field effect transistor 1 with stepped bandgap ohmic contact of the present invention are enhanced.

In some embodiments, the intermediate bandgap layer 60 is made of $Al_xGa_{1-x}As$, wherein the ratio of the composition of aluminum to gallium is x:1−x, wherein x is greater than or equal to 0.1 and less than or equal to 0.28, greater than or equal to 0.1 and less than or equal to 0.26, greater than or equal to 0.1 and less than or equal to 0.24, greater than or equal to 0.1 and less than or equal to 0.22, greater than or equal to 0.1 and less than or equal to 0.2, greater than or equal to 0.12 and less than or equal to 0.3, greater than or equal to 0.14 and less than or equal to 0.3, greater than or equal to 0.16 and less than or equal to 0.3, greater than or equal to 0.18 and less than or equal to 0.3 or greater than or equal to 0.2 and less than or equal to 0.3; while the sub-intermediate bandgap layer 65 is made of $Al_yGa_{1-y}As$, wherein the ratio of the composition of aluminum to gallium is y:1−y, wherein y is less than x.

Figure 4:
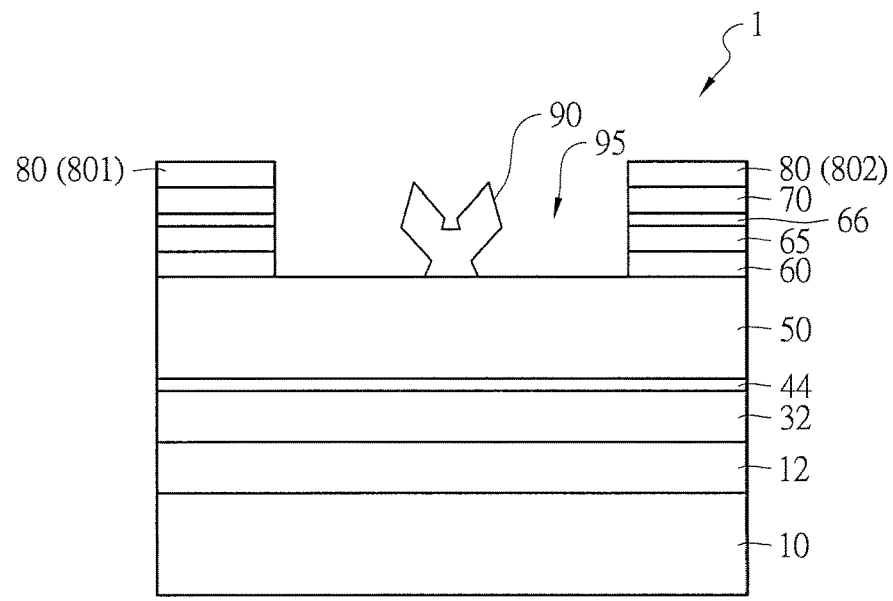
FIG. 4 is a sectional schematic view of an embodiment of another InGaAlP Schottky field effect transistor with stepped bandgap ohmic contact of the present invention.

Please refer to FIG. 4, which is a sectional schematic view of an embodiment of another InGaAlP Schottky field effect transistor with stepped bandgap ohmic contact of the present invention. The main structure of the embodiment of FIG. 4 is basically the same as the structure of the embodiment of FIG. 3, except that it further comprises an etching stop layer 66, wherein the etching stop layer 66 is formed between the sub-intermediate bandgap layer 65 and the cap layer 70, wherein the etching stop layer 66 is made of AlAs.

Figure 5:
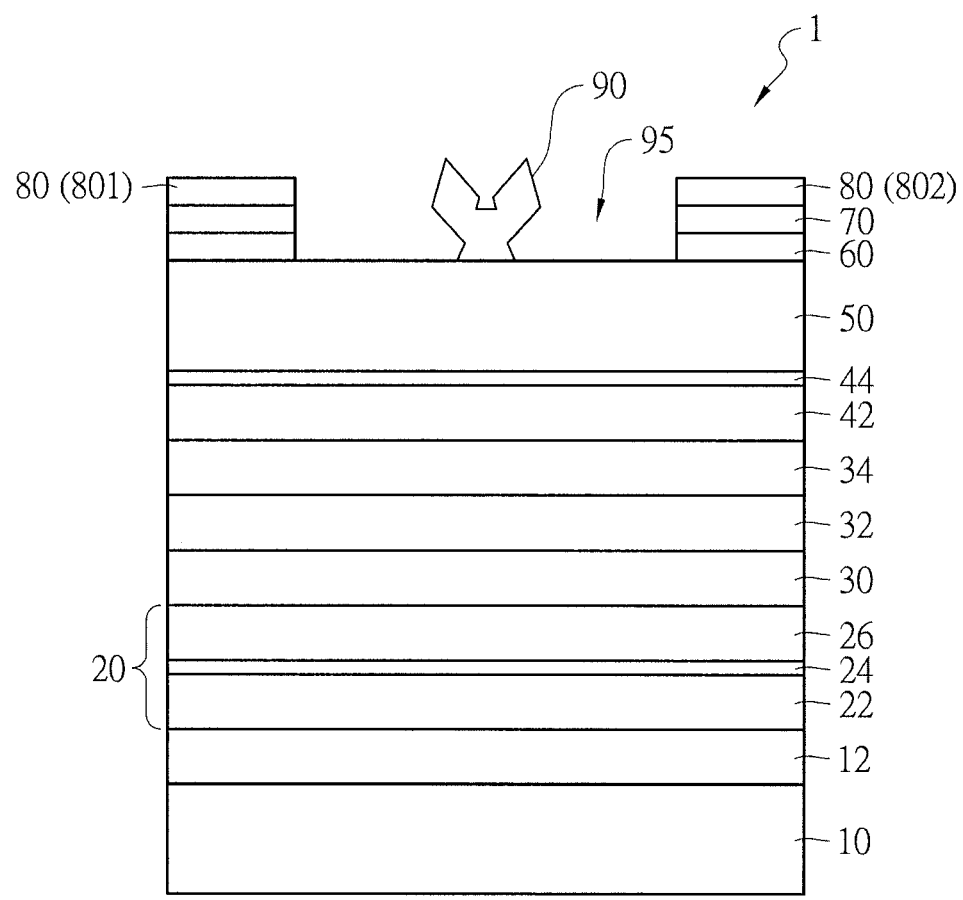
FIG. 5 is a sectional schematic view of an embodiment of an InGaAlP Schottky field effect transistor with stepped bandgap ohmic contact of the present invention.

Please refer to FIG. 5, which is a sectional schematic view of an embodiment of an InGaAlP Schottky field effect transistor with stepped bandgap ohmic contact of the present invention. The main structure of the embodiment of FIG. 5 is basically the same as the structure of the embodiment of FIG. 1, except that it further comprises a lower barrier layer 20, a first spacer layer 30, a second spacer layer 34 and an upper-barrier spacer layer 42. The lower barrier layer 20 is Ruined on the buffer layer 12, wherein the lower barrier layer 20 is made of at least one material selected from the group consisting of: GaAs and AlGaAs. The first spacer layer 30 is formed on the lower barrier layer 20, wherein the first spacer layer 30 is made of GaAs. The channel layer 32 is formed on the first spacer layer 30. The second spacer layer 34 is formed on the channel layer 32, wherein the second spacer layer 34 is made of GaAs. The upper-barrier spacer layer 42 is formed on the second spacer layer 34, wherein the upper-barrier spacer layer 42 is made of at least one material selected from the group consisting of: GaAs, AlGaAs, InGaP and InGaAlP. The carrier supply layer 44 is formed on the upper-barrier spacer layer 42. The Schottky barrier layer 50 is formed on the carrier supply layer 44.

In some embodiments, the lower barrier layer 20 comprises a lower-barrier sub-layer 22, a lower carrier supply layer 24 and a lower-barrier spacer layer 26. The lower-barrier sub-layer 22 is formed on the buffer layer 12, wherein the lower-barrier sub-layer 22 is made of at least one material selected from the group consisting of: GaAs and AlGaAs. The lower carrier supply layer 24 is formed on the lower-barrier sub-layer 22, wherein the lower carrier supply layer 24 is made of at least one material selected from the group consisting of: GaAs and AlGaAs. The lower-barrier spacer layer 26 is formed on the lower carrier supply layer 24, wherein the lower-barrier spacer layer 26 is made of at least one material selected from the group consisting of: GaAs and AlGaAs. The first spacer layer 30 is formed on the lower-barrier spacer layer 26.

Figure 6:
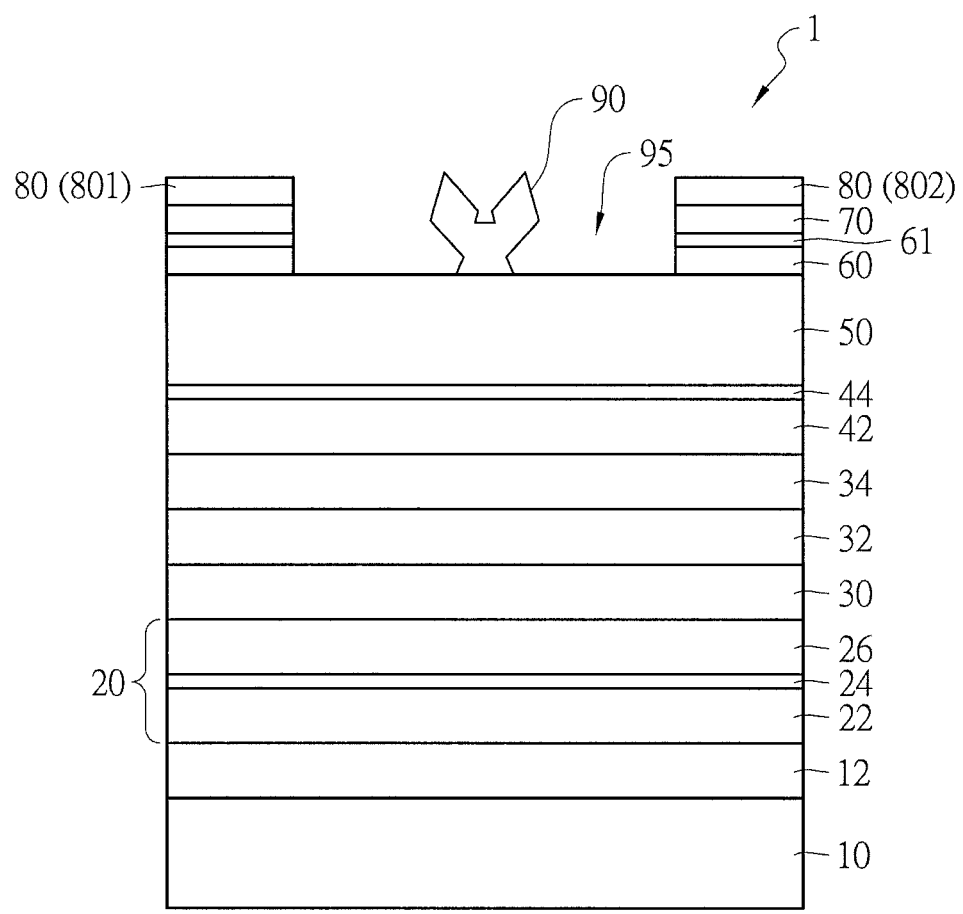
FIG. 6 is a sectional schematic view of an embodiment of another InGaAlP Schottky field effect transistor with stepped bandgap ohmic contact of the present invention.

Please refer to FIG. 6, which is a sectional schematic view of an embodiment of another InGaAlP Schottky field effect transistor with stepped bandgap ohmic contact of the present invention. The main structure of the embodiment of FIG. 6 is basically the same as the structure of the embodiment of FIG. 5, except that it further comprises an etching stop layer 61, wherein the etching stop layer 61 is formed between the intermediate bandgap layer 60 and the cap layer 70, wherein the etching stop layer 61 is made of AlAs.

Figure 7:
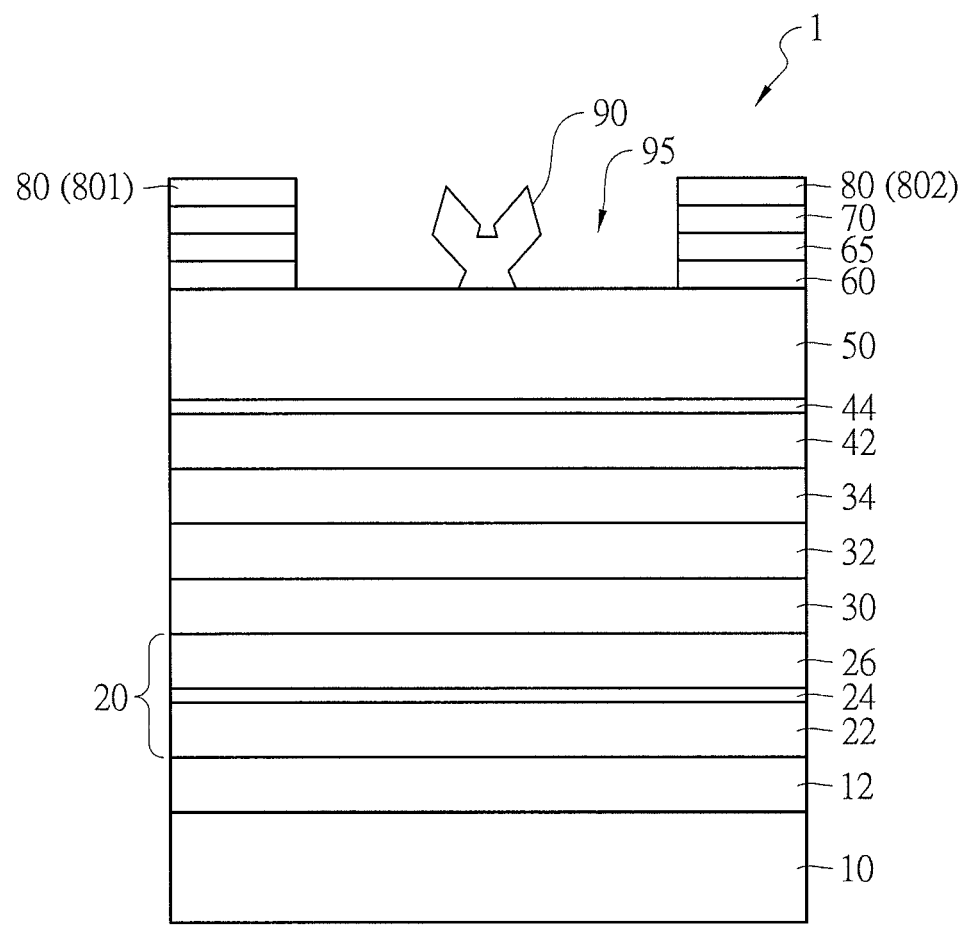
FIG. 7 is a sectional schematic view of an embodiment of an InGaAlP Schottky field effect transistor with stepped bandgap ohmic contact of the present invention.

Please refer to FIG. 7, which is a sectional schematic view of an embodiment of an InGaAlP Schottky field effect transistor with stepped bandgap ohmic contact of the present invention. The main structure of the embodiment of FIG. 7 is basically the same as the structure of the embodiment of FIG. 5, except that it further comprises a sub-intermediate bandgap layer 65, wherein the sub-intermediate bandgap layer 65 is formed between the intermediate bandgap layer 60 and the cap layer 70. The sub-intermediate bandgap layer 65 has a sub-intermediate bandgap, wherein the sub-intermediate bandgap is less than the intermediate bandgap and greater than the cap-layer bandgap. The sub-intermediate bandgap layer 65 is made of at least one material selected from the group consisting of: InGaP, InGaAsP, InAlP and AlGaAs. In a preferable embodiment, the intermediate bandgap layer 60 is made of $Al_xGa_{1-x}As$, wherein the ratio of the composition of aluminum to gallium is x:1−x, wherein x is greater than or equal to 0.1 and less than or equal to 0.3; while the sub-intermediate bandgap layer 65 is made of $Al_yGa_{1-y}As$, wherein the ratio of the composition of aluminum to gallium is y:1−y, wherein y is less than x.

Figure 8:
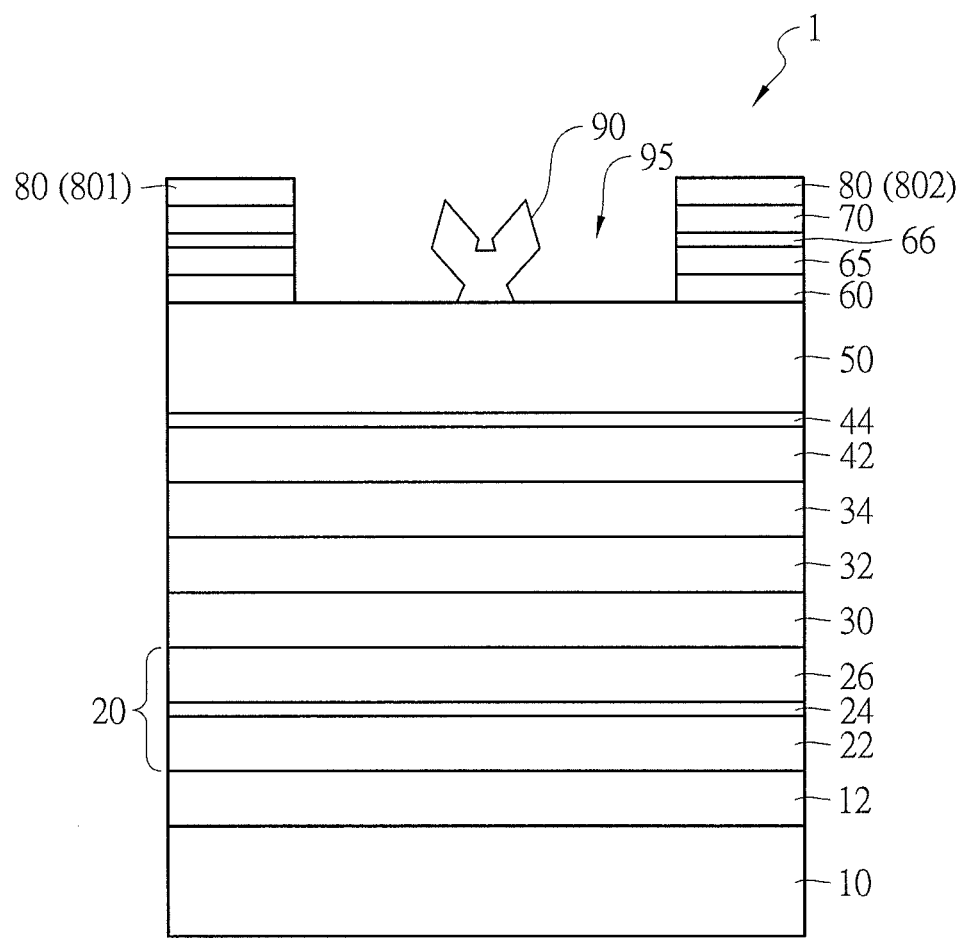
FIG. 8 is a sectional schematic view of an embodiment of another InGaAlP Schottky field effect transistor with stepped bandgap ohmic contact of the present invention.

Please refer to FIG. 8, which is a sectional schematic view of an embodiment of another InGaAlP Schottky field effect transistor with stepped bandgap ohmic contact of the present invention. The main structure of the embodiment of FIG. 8 is basically the same as the structure of the embodiment of FIG. 7, except that it further comprises an etching stop layer 66, wherein the etching stop layer 66 is formed between the sub-intermediate bandgap layer 65 and the cap layer 70, wherein the etching stop layer 66 is made of AlAs.

As disclosed in the above description and attached drawings, the present invention can provide an InGaAlP Schottky field effect transistor with stepped bandgap ohmic contact. It is new and can be put into industrial use.

Although the embodiments of the present invention have been described in detail, many modifications and variations may be made by those skilled in the art from the teachings disclosed hereinabove. Therefore, it should be understood that any modification and variation equivalent to the spirit of the present invention be regarded to fall into the scope defined by the appended claims.

What is claimed is:

1. An InGaAlP Schottky field effect transistor with stepped bandgap ohmic contact comprising:
    a compound semiconductor substrate;
    a buffer layer formed on said compound semiconductor substrate;
    a channel layer formed on said buffer layer;
    a carrier supply layer formed on said channel layer;
    a Schottky barrier layer formed on said carrier supply layer, wherein said Schottky barrier layer is made of InGaAlP;
    an intermediate bandgap layer formed on said Schottky barrier layer;
    a cap layer formed on said intermediate bandgap layer; and
    an ohmic metal layer formed on said cap layer, wherein said ohmic metal layer and said cap layer form an ohmic contact;
    wherein said Schottky barrier layer, said intermediate bandgap layer and said cap layer have a Schottky-barrier-layer bandgap, an intermediate bandgap and a cap-layer bandgap respectively, wherein said intermediate bandgap is less than said Schottky-barrier-layer bandgap and greater than said cap-layer bandgap.

2. The InGaAlP Schottky field effect transistor with stepped bandgap ohmic contact according to claim 1, wherein said intermediate bandgap layer is made of $Al_xGa_{1-x}As$.

3. The InGaAlP Schottky field effect transistor with stepped bandgap ohmic contact according to claim 2, wherein the aluminum composition x is greater than or equal to 0.1 and less than or equal to 0.3.

4. The InGaAlP Schottky field effect transistor with stepped bandgap ohmic contact according to claim 1, wherein said intermediate bandgap layer is made of at least one material selected from the group consisting of: InGaP, InGaAsP and InAlP.

5. The InGaAlP Schottky field effect transistor with stepped bandgap ohmic contact according to claim 1, further comprising an etching stop layer, wherein said etching stop layer is formed between said intermediate bandgap layer and said cap layer.

6. The InGaAlP Schottky field effect transistor with stepped bandgap ohmic contact according to claim 5, wherein said etching stop layer is made of AlAs.

7. The InGaAlP Schottky field effect transistor with stepped bandgap ohmic contact according to claim 5, wherein said cap layer is made of GaAs.

8. The InGaAlP Schottky field effect transistor with stepped bandgap ohmic contact according to claim 1, wherein said cap layer is made of GaAs.

* * * * *